Dec. 4, 1956 W. F. SANDS 2,773,194
EXTENDED-RANGE HIGH-FREQUENCY TUNING DEVICE AND CIRCUIT
Filed Jan. 16, 1952 2 Sheets-Sheet 1
Fig. 1.
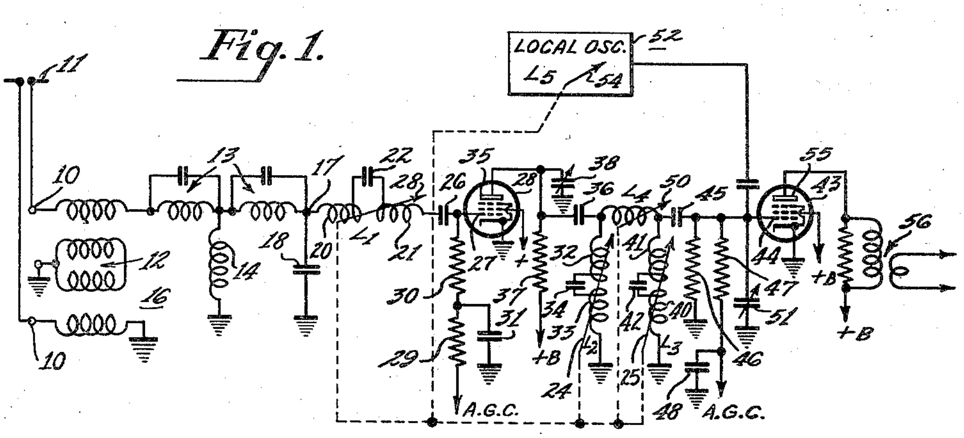
Fig. 2. Fig. 3.
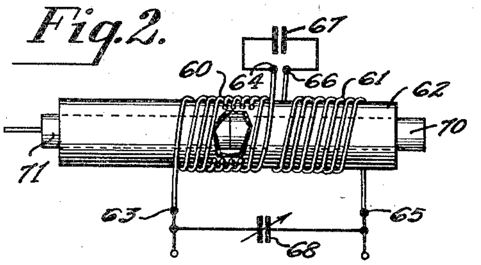
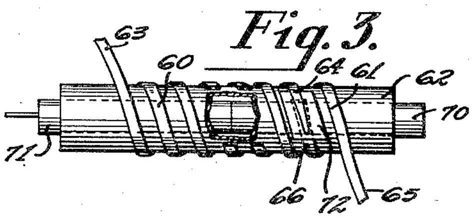
Fig. 4.
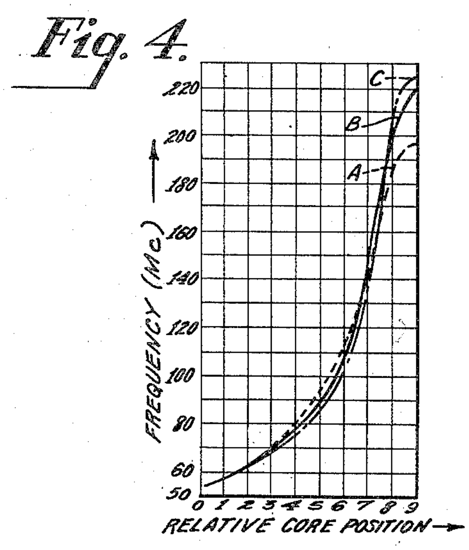
Fig. 5.
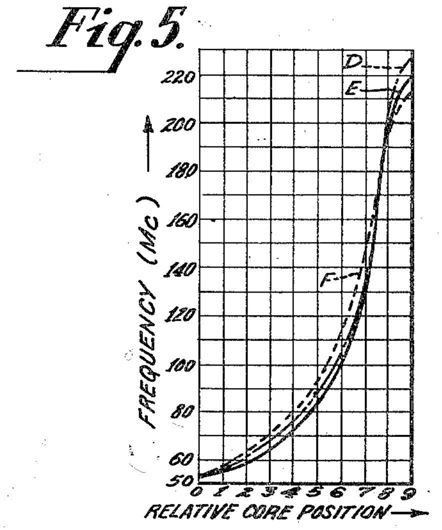
INVENTOR
William F. Sands
BY H. W. ...
ATTORNEY Dec. 4, 1956 W. F. SANDS 2,773,194

EXTENDED-RANGE HIGH-FREQUENCY TUNING DEVICE AND CIRCUIT

Filed Jan. 16, 1952 2 Sheets-Sheet 2

INVENTOR
William F. Sands
BY H. L. Newton
ATTORNEY

United States Patent Office 2,773,194

Patented Dec. 4, 1956

2,773,194

EXTENDED-RANGE HIGH-FREQUENCY TUNING DEVICE AND CIRCUIT

William F. Sands, Haddonfield, N. J., assignor to Radio Corporation of America, a corporation of Delaware Application January 16, 1952, Serial No. 266,678

The terminal 15 years of the term of the patent to be granted has been disclaimed 6 Claims. (Cl. 250—40)

This invention relates generally to high frequency variable tuning systems, and more particularly to a tuning device and circuit for increasing the tuning range of very-high frequency and ultra-high frequency variable-inductance tuned circuits of the movable tuning core type.

It is conventional practice to effect variable tuning of signal responsive or resonant circuits of modern signal receiving systems and the like by movable core type tuning elements associated with inductance elements forming part of such circuits, thereby to vary the inductance of the circuits conceived. The range of inductance variation obtainable with a movable core element of the paramagnetic type is determined in part by the effective permeability of the core. As the operating frequency of such circuits is increased, the size of the particles of the magnetic material in the core elements must be reduced, and the proportion of core material to binder and insulation becomes proportionally less, whereby the effective permeability is decreased. To increase the range of inductance variation obtainable with tuned movable core type coils or inductance elements, the core elements may each be divided into two separate sections, one being of a magnetically permeable or paramagnetic material and the other of a conductive material such as copper. Such a core assembly is disclosed, for example, by Bailey Patent 1,706,837 of March 26, 1929, and is hereinafter referred to as a composite or complex core or core element. When moved into the field of the inductance element, the portion of the core element which is composed of conductive material acts as a short-circuited or partially short-circuited winding, depending upon the conductivity of the material, thereby decreasing the inductance of the inductance element below its value when the core element is withdrawn. However, it is not practical to reduce the short-circuiting effect of the core element completely and the tuning range is limited by the residual inductance still presented by the inductor alone.

The residual inductance of a variable inductance tuned circuit may be defined as that remaining after the variable inductance tuning element has been adjusted to have a minimum inductance. The residual inductance may include the inductance of circuit elements other than the inductive tuning element as well as the inductance of the leads of various circuit elements and the wiring or conductors in circuit between such elements. The residual inductance limits the minimum inductance to which a variable-inductance tunable circuit may be adjusted and thereby limits the circuit tuning at the high frequency end of the tuning range.

It is therefore a principal object of this invention to provide an improved, movable core type, variable-inductance tuning device and circuit having an extended high frequency tuning range effectively greater than has heretofore been attainable.

Another object of this invention is to provide a simple movable-core type, variable-inductance, resonant circuit tuning structure in which the effective inductance of the structure is greatly decreased at the high frequency end of the circuit tuning range.

A further object of this invention is to provide a tunable signal-responsive circuit in which residual inductive reactance of the circuit is effectively reduced at high frequencies, thereby to extend the frequency range.

Still another object is to provide an improved tuning system for television receivers and the like, in which the tunable resonant circuits for signal selection may be adjusted to cover a relatively wide frequency band or range by means of a single variable inductance element in each circuit.

In accordance with the invention, the tuning range of high frequency circuits employing composite core tuning means is extended to enable the circuits to tune in a relatively wide frequency band, such as the presently assigned television channels in the 54 megacycle (mc.) to 216 mc. range, without the necessity of switching inductors, capacitors, or tuned circuits. The extension of the tuning range of circuits employing variable resonant structures such as composite core tuned inductors is accomplished by reducing the residual inductance of the circuit at one end of the tuning range. In one embodiment of the invention a capacitor is inserted intermediate the ends of a variable tuning inductor and cooperates with a movable composite core to increase the tuning range in the manner referred to.

In a further embodiment of the invention, a shield or spaced deflector plate for the tuning inductor is provided to reduce the residual inductance of the circuit. The deflector plate is positioned adjacent the structure comprising the tuning inductor and the low radio-frequency potential end of the inductor is directly connected to the deflector plate. The deflector plate not only acts as a low impedance path for radio frequency currents but in addition reduces the residual inductance of the inductor as will hereinafter be seen. Although a conventional shield-can may be employed as the deflector plate, as will also hereinafter be explained, it is to be understood that the shielding effect of the deflector plate is of secondary importance with respect to its function of reducing the residual inductance of the tunable resonant circuit.

The novel features characteristic of this invention are set forth with particularity in the appended claims. The invention itself, however both as to its organization and method of operation, as well as additional objects and advantages thereof, will best be understood from the following description when read in connection with the accompanying drawings in which like reference characters represent like parts, and in which:

Figure 1 is a schematic circuit diagram of a portion of a high-frequency signal receiver having tunable signal selecting circuits constructed in accordance with the present invention;

Figure 2 is a plan view of a resonant variable tuning circuit and structure embodying the invention, a portion of the structure being cut away to show constructional details;

Figure 3 is a plan view of a resonant variable tuning structure as a further embodiment of the invention; a portion thereof being cut away to show details of construction;

Figure 4 is a graph showing curves illustrating variations of the resonant frequency of a tuning structure embodying the invention under certain conditions of operation;

Figure 5 is a further graph showing curves which illustrate variations of the resonant frequency of a tuning structure embodying the invention under certain other conditions of operation;

Figure 6:
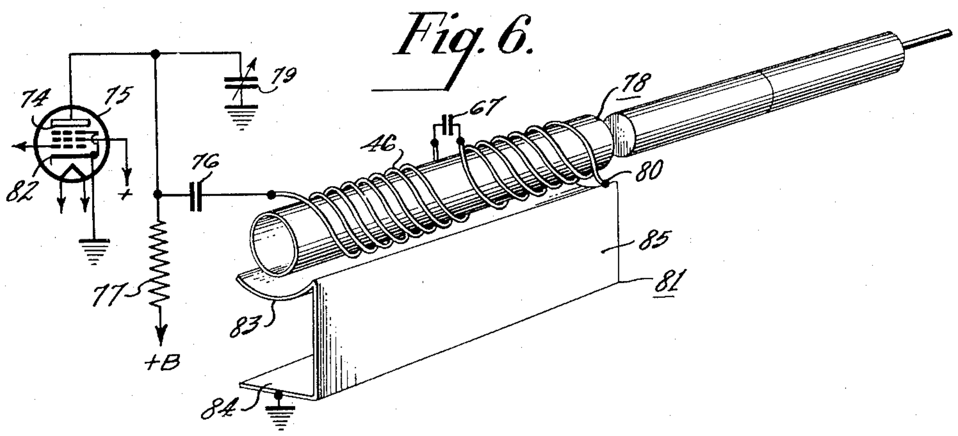
Figure 6 is a perspective view of a variably tunable inductor or tuning structure and associated schematic circuit diagram showing a further embodiment of the invention.

Referring to Figure 1, a modulated high frequency carrier-wave or signal receiver, such as a television receiver, is provided with input terminals 10 connected with a suitable signal source, such as a dipole antenna 11, for intercepting signal energy over a relatively wide frequency band.

Received signals are conveyed from the dipole through an input network 16 which may include an antenna transformer 12 and an m-derived high-pass filter section 13 which cuts off just below the lowest frequency in the desired signal band which in this case is the lowest television channel. The high potential signal output terminal 17 may be directly connected to one terminal of the variably tunable structure $L_1$, as provided by the invention and which will be discussed in detail in connection with the remaining figures. A grounded capacitor 18 is also in circuit between the output terminal 17 of the input network 16 and ground to provide impedance matching means between the filter section and the tunable structure $L_1$ and in addition to prevent overloading of the tunable structure $L_1$.

The resonant variable tuning structure $L_1$, having two inductors 20 and 21 coupled by a capacitor 22, is tunable by a composite core, indicated by the arrow 23, which includes a magnetically permeable portion and a conducting portion such as copper. This composite core may be mechanically coupled to the other similar tuning elements 24 and 25 of the other similar resonant tunable structures $L_2$ and $L_3$ within the receiver, to provide unicontrol means as is indicated in the figure by the dotted lines.

The other terminal of the tunable structure $L_1$, is coupled through the capacitor 26 to the input grid 27 of a radio frequency amplifier tube 28 which, by way of example, may be of the 6AG5 type. An automatic gain control voltage (AGC) may be applied to the grid 27 through a filter resistor 29 and a grid resistor 30. A grounded capacitor 31 is connected in parallel with filter resistor 29 to bypass radio frequency currents to ground.

A second tunable structure $L_2$, substantially identical to the first tunable structure $L_1$, includes the inductors 32, 33 and a capacitor 34 connected in series therewith, and has one of its terminals coupled to the anode 35 of tube 28 by means of a capacitor 36, while its other terminal is connected to ground thereby providing, with the trimmer capacitor 38, a parallel resonant tunable output circuit for the radio amplifier tube 28. A suitable operating potential +B is applied to the anode 35 through a plate resistor 37. The variable trimmer capacitor 38 is connected between the anode 35 and ground, and may be adjusted to properly tune the anode circuit at the low frequency end of the pass band.

A third resonant structure $L_3$, substantially identical to the resonant structures $L_1$ and $L_2$, includes the inductors 40, 41 and a capacitor 42 and functions to tune the input circuit of a mixer tube 43. One terminal of the resonant structure $L_3$ is grounded and the other terminal is coupled to the first or control grid 44 of the mixer tube through a coupling capacitor 45. A grid resistor 46 provides a direct current path from the grid 44 to ground. An automatic gain control voltage (AGC), may be applied to the grid 44 through a resistor 47 which is bypassed for radio frequency currents by a capacitor 48.

The anode terminal of $L_2$ and the grid terminal of $L_3$ are coupled by a variable inductor $L_4$ which is core tuned and which has its core, indicated by the arrow 50, ganged to the tuning cores of the tunable structures $L_1$, $L_2$ and $L_3$ so as to provide a uniform coupling between structures $L_2$ and $L_3$ over the entire desired signal band. A trimmer capacitor 51 is in circuit between the grid 44 and ground and may be adjusted to properly tune the grid input circuit at the low frequency end of the tuning range.

Grid 44 of mixer tube 43 is further coupled to a local oscillator 52 through a capacitor 53. The local oscillator 52 may be of any of the well known types of oscillator circuits such as a Colpitts oscillator and a description of its operation is not deemed to be necessary. The arrow 54 represents a tuning core for tuning the local oscillator 52. The core represented by the arrow 54 is ganged to the tuning cores of the resonant structures $L_1$, $L_2$, $L_3$ and $L_4$ to enable the local oscillator to be adjusted simultaneously with the adjustment of the radio-frequency circuits of the receiver so that proper tracking may be maintained throughout the tuning range of the receiver.

The output circuit of the mixer tube 43 is connected from the anode 55 through an output circuit network 56 which may be an intermediate frequency transformer as indicated. The transformer 56 may be coupled to any suitable utilization circuit, which not being a part of this invention is not shown in the drawings.

One form of the variably tunable signal selecting structures, $L_1$, $L_2$ and $L_3$ of this invention is illustrated in Figure 2. A pair of inductors 60 and 61 is provided on a suitable cylindrical coil form 62 of insulating material. Inductor 60 has an outer terminal 63 and an inner terminal 64. Similarly inductor 61 has an outer terminal 65 and an inner terminal 66. In constructing the tunable structure, a single inductor may be initially wound on form 62 and the single inductor then broken at its midpoint to produce the two inductors 60, 61 with their respective inner terminals 64 and 66. The inner terminals 64, 66 of inductors 60, 61 are coupled together by a capacitor 67 thereby forming a series circuit including the inductor 60, the capacitor 67 and the inductor 61. The variable capacitor 68 connected in circuit with the outer terminals 63, 65 is a trimmer capacitor corresponding to the capacitors 38 or 51 of Figure 1 and is employed to adjust the frequency of the parallel resonant circuit at the low frequency end of the tuning range.

The resonant frequency of the tuning structure is varied by means of a composite core which consists of a magnetically permeable element 70 and an element 71 composed of a highly conductive material which, by way of example, may be copper. The magnetic permeable element 70 may consist, for example, of individually insulated particles of carbonyl iron molded under high pressure to the desired shape in accordance with the teachings of the patents to Speed 1,274,952 and Andrews 1,669,644. Preferably, element 70 should consist of a material having a high magnetic permeability.

When the permeable element 70 is in the inductor portions 60, 61 of the resonant structure, the inductance of the tunable structure is at a maximum and a trimmer capacitor such as the capacitor 68 may be adjusted to tune the circuit to resonance at the low frequency end of the band, for example, at a frequency of 54 mc. At the low frequency end of the band the impedance of the series capacitor 67 is small as compared to the impedance of the inductors 60 and 61, and therefore has only a minor effect on the total circuit impedance. As the conducting portion 71 of the tuning core is inserted into the inductor portions 60, 61 of the tuning structure, the inductance of the tuning structure decreases due to the short-circuited turn effect of the conducting portion of the core. With the conducting portion of the core fully inserted into the coil portion of the structure, the inductance of the structure is at a minimum and the circuit is resonant at a frequency within the high end of the band. At the high frequency end of the band the capacitance of the capacitor 67 presents a reactance to the radio-frequency currents which is opposite in sign to the inductive reactance presented by the inductor sections 60, 61 which is effectively reduced by the conducting core portion 71. This inductive reactance at the high frequency end of the band is part of the residual inductance of the circuit and is present because the short-circuited turn effect of the conductive portion of the tuning core is not perfect. However, by introducing a reactance of opposite sign into the circuit such as that due to capacitor 67, the effect of the residual inductance present may be decreased. It is to be noted that the tuning range of the tunable structure is extended at the high end of the range that is when the conducting portion of the core is inserted into the inductor portion of the structure. As a result the invention is equally applicable to inductors which are tuned by simple copper or other conductive material cores as well as to composite core tuned inductors.

Figure 3 illustrates a preferred embodiment of the variable resonant structure in accordance with the invention. In this embodiment the inductors 60 and 61 consist of a conductive strap, such as copper, which is broken at a selected intermediate point to provide the inner terminals 64 and 66. The ends of the straps thus formed are overlapped and a sheet of thin insulating material 72 inserted between the overlapped straps to provide the dielectric of the series capacitor 67 of Figure 2. The capacity of the series capacitor is determined by the width of the strap, the length of the overlap, and the dielectric constant of the insulating material.

It is to be understood that the inductors 60, 61 of Figure 3 need not be wound from a conductive strap, but the conductor may be applied to the coil form 62 by electrolytically depositing a conducting material on the coil form or by spraying or printing the conducting material, or other well known methods to obtain the inductors 60, 61. A method of obtaining a printed inductance has been disclosed in the Ryder Patent 1,837,678. By following the teachings of Schoop, 1,256,589, an inductor may be obtained by spraying metal on a coil form.

A group of curves which indicate the change of resonant frequency of the tunable resonant structure as a function of relative core position for various values of series capacitance is shown in Figure 4.

Curve A illustrates the tuning range for a structure similar to that shown in Figure 3, with the exception that there was no discontinuity between inductors 60 and 61. In other words, the series capacitor had a value equal to infinity. With the permeable element 70 inserted into the inductor portion 60, 61 of the resonant structure, the structure was tuned to resonate at approximately 54 megacycles by a trimmer capacitor connected across the structure similar to capacitor 68 of Figure 2. With the conducting portion 71 inserted into the inductor portion of the resonant structure, the structure was found to be resonant at approximately 196 mc. The structure, therefore, with no discontinuity in the winding, had a tuning range of approximately 3.6 to 1.

It is at once apparent that a tuning range of 3.6 to 1 is insufficient to cover the television channels in the 54 to 216 mc. band. The tuning range required to cover the aforementioned television channels must be equal to at least 4 to 1.

Curves B and C of Figure 4 illustrate the tuning range of the resonant structure when the inductor was broken at approximately its mid-point and capacitors having values of 22 and 10 micro-microfarads respectively were inserted between the inductors. It is seen that a valuable increase in tuning range has been secured, and the structure in accordance with the invention has a tuning range greater than 4 to 1, which permits tuning of the entire band of the aforementioned television channels.

Figure 5 is a graph of a series of curves illustrating the change in resonant frequency in megacycles as a function of relative core position for a tunable structure similar to that of Figure 3. In each instance a series capacitor, such as capacitor 67 of Figure 2, having a value of approximately 10 micro-microfarads was inserted at different points in circuit with sections 60, 61 of the tunable structure. Curve D illustrates the tuning range for a tunable structure having a series capacitance inserted at its midpoint (i. e., the number of turns of inductor 60 being equal to the number of turns of inductor 61). Curve E illustrates the tuning range of a structure having the series capacitance placed a distance from the conducting core end 71 of the structure equal to about one-fourth the total length of the inductors; the curve F represents a tuning structure having the series capacitance placed a distance from the permeable element end 70 of the structure equal to approximately one-fourth of the length of the coil portion. It is apparent from the curves of Figure 5 that the tuning range of the structure is greatest when the series capacitor is inserted at a point midway between the inductor sections 60, 61, that is, when the number of turns of inductor portion 60 is equal to the number of turns of inductor 61.

The following dimensions, values, and materials for a variable resonant structure constructed in accordance with this invention to cover the television channels in the 54 mc. to 216 mc. band are given below by way of example only:

The inductors 60, 61 may consist of nine turns each of copper strap one-sixteenth inch wide by 0.0045 inch thick;

The cylindrical insulating coil form 62 may have an inside diameter of 0.254 inch and an outside diameter of 0.274 inch;

The inductor length may be about one and one-half inches;

The tuning core may have a permeable portion having a one-quarter inch diameter by a one and one-half inch length which is the total length of the inductor, and a copper portion of like dimensions.

A further embodiment of the present invention is illustrated in Figure 6. The variably tunable inductor $L_6$ is coupled to the anode 74 of a tube 75 through a capacitor 76. The tube 75 may, by way of example, be a radio-frequency amplifier. A suitable positive potential may be applied to the anode 74 through an anode resistor 77. A composite core 78 is arranged to be axially movable with respect to the inductor $L_6$ whereby the resonant frequency of inductor $L_6$ is varied. A variable trimmer capacitor 79 is connected between the anode 74 and ground. The low radio-frequency potential terminal 80 of the inductor $L_6$ is directly connected to a shield or space deflector plate 81 which in turn is directly connected to the cathode 82 of tube 75 through a ground connection which may be the receiver chassis. The deflector plate 81 is herein referred to as a "space deflector plate" since it, in effect, bridges or removes the space between the variable resonant inductor or tunable structure $L_6$ and the receiver chassis indicated as ground. As hereinbefore stated, when the conductive portion of the tuning core is inserted within the inductor section of the tunable structure the structure is tuned to the high-frequency end of the band and the inductance of the structure due to the inductor is at a minimum. The residual inductance of the tunable structure then consists mainly of the inductance of the core in shunt with the inductance of the effectively short-circuited inductor. By positioning the deflector plate 81 adjacent the tunable structure, and by connecting the low radio frequency potential terminal of the tunable structure to the deflector plate, not only is a low impedance path provided for the radio-frequency currents but, in addition, the inductance of the deflector plate tends to cancel the inductance of the tunable structure thereby further decreasing the residual inductance of the circuit and increasing the tuning range.

The deflector plate 81 illustrated in Figure 6 comprises a pair of horizontal portions 83 and 84 connected together and maintained in spaced relation by a vertical portion 85. The horizontal portion 83 is shaped to conform to the outline of the inductor $L_6$. The deflector plate may be composed of copper or some similar conducting material and is preferably spaced just far enough from the inductor so that the capacitance between the inductor and the deflector plate is not unduly increased.

Figure 7:
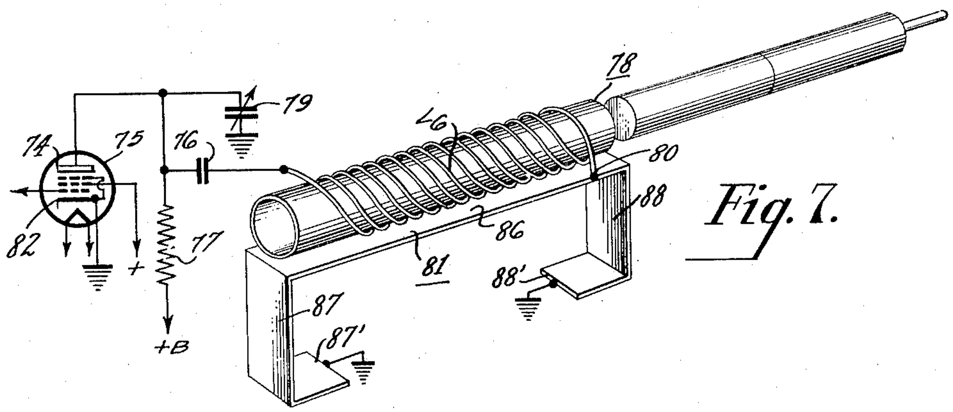
Figure 7 is a perspective view of a modification of the variably tunable inductor and circuit illustrated in Figure 6 in accordance with the invention.

Figure 7 illustrates a further embodiment of the deflector plate 81. In Figure 7, the deflector plate comprises a horizontal conducting strip 86 arranged adjacent the inductor $L_6$ and supported above the chassis by supporting legs 87 and 88 at each end of the strip 86. The legs 87 and 88 have additional horizontal portions 87′ and 88′ respectively which may be affixed to the chassis by soldering, bolting, or other known means.

In Figure 7 the series capacitor, such as the capacitor 67 of Figure 6 connected between the windings of the inductor $L_6$, has been omitted and the inductance of the deflector plate 86 alone is relied on to reduce the residual inductance of the inductor $L_6$.

Figure 8:
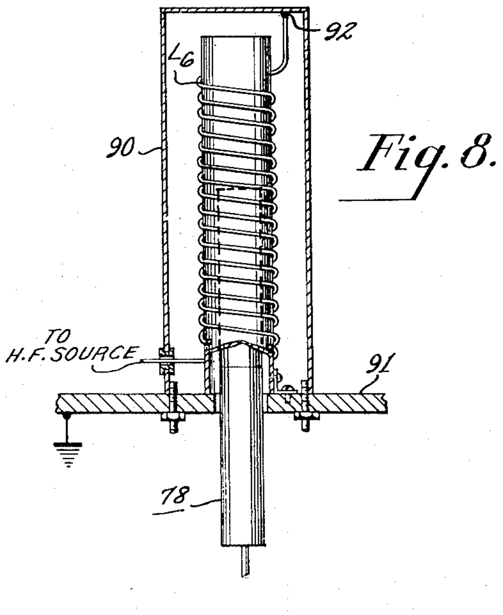
Figure 8 is a view in elevation and partly in section of a variable tunable inductor showing a further modification of the inductor of Figure 7, in accordance with the invention.

It is to be understood that the present invention is not limited to the particular shape of the deflector plates 81 illustrated in Figure 6 and 7. For example, Figure 8 shows the use of a conventional shield can 90, affixed to a radio receiver chassis 88 and connected to the inductor $L_6$ to provide a low inductance path for radio frequency currents. In this embodiment the low potential terminal of $L_6$ is directly connected to the shield can 90, at a point such as point 92. Shield can 90, not only minimizes radiation from the inductor $L_6$ but decreases the residual inductance of the circuit tuned by the inductor $L_6$, as hereinbefore explained, and thereby extends the effective tuning range of the inductor.

There has thus been described a variable high-frequency tuning structure and system embodying a tuning core including a conductive portion cooperating with a pair of coils and a series capacitor whereby the effective inductance of the structure is decreased at the high-frequency end of the tuning range thereby providing a useful increase of the tuning range of permeability tuned coils. In addition, means comprising a conducting or space deflector plate arranged adjacent the tuning structure has been described for decreasing the residual inductance of the high frequency structure.

What is claimed is:

1. A high frequency tuning inductor of the variable permeability type comprising a pair of helical windings, in substantially end-to-end relation on a common axis, capacitor means interposed between and coupling the adjacent ends of said windings, and variable tuning means longitudinally movable with respect to and in the field of said windings.

2. A variable high frequency tuning inductor comprising a cylindrical coil form of insulating material, a pair of single layer windings surrounding said coil form in end-to-end relation, capacitive means coupling the adjacent ends of the two windings, and a tuning core element having a conducting portion longitudinally movable within said coils to increase the tuning range of said inductor.

3. A tunable structure for high frequency signal circuits and the like, comprising a first conductive strap coil, a second conductive strap coil adjacent said first coil and coaxial therewith, means connecting a reactive impedance effectively in series with said coils, said reactive impedance comprising the end portion of said second coil overlapping and insulated from an end portion of said first coil, and a tuning core element including a conducting portion and a magnetically permeable portion longitudinally movable with respect to and along the axis of said coils.

4. A variable tuning structure for high frequency signal circuits and the like, comprising a coil form of insulating material, a first conductive strap inductor surrounding said form, a second conductive strap inductor surrounding said form adjacent to said first strap in end-to-end relation thereto, said second inductor having an end portion thereof overlapping the adjacent end portion of said first inductor, a strip of insulating material interposed between said overlapping end portions whereby said end portions are capacitively coupled, a tuning core movable with respect to said inductors along the interior of the coil form and having a highly conductive portion for extending the tuning range of said structure, and means providing connection terminals for said variable tuning structure at the free ends of said first and second conductive strip inductors.

5. A high frequency tuning inductor of the variable permeability type comprising a pair of helical windings in substantially end-to-end relation on a common axis, capacitor means interposed between and coupling the adjacent ends of said windings, variable tuning means longitudinally movable with respect to the field of said windings, and a conducting plate positioned adjacent to and along said windings in inductive coupling relation thereto and connected effectively in series with said windings to provide a low impedance path for high frequency currents.

6. A variable high frequency tuning inductor comprising a cylindrical coil form of insulating material, a pair of single layer windings surrounding said coil form in end-to-end relation, capacitive means coupling the adjacent ends of the two windings, a tuning core element having a conducting portion longitudinally movable within said coils to increase the tuning range of said inductor, and a conducting plate positioned adjacent to and along said windings and connected between one of said windings and ground.

References Cited in the file of this patent

UNITED STATES PATENTS

| | | |
|---|---|---|
| 2,141,890 | Weiss | Dec. 27, 1938 |
| 2,276,699 | Preisig | Mar. 17, 1942 |
| 2,325,279 | Schaper | July 27, 1943 |
| 2,338,134 | Sands et al. | Jan. 4, 1944 |
| 2,368,857 | McClellan | Feb. 6, 1945 |
| 2,591,081 | Lyman et al. | Apr. 1, 1952 |
| 2,598,810 | Lyman | June 3, 1952 |